United States Patent [19]

Yoshinaga

[11] Patent Number: 5,296,754
[45] Date of Patent: Mar. 22, 1994

[54] PUSH-PULL CIRCUIT RESISTANT TO POWER SUPPLY AND TEMPERATURE INDUCED DISTORTION

[75] Inventor: Yoshiro Yoshinaga, Yokohama, Japan

[73] Assignee: Kabushiki Kaisha Toshiba, Kawasaki, Japan

[21] Appl. No.: 66,930

[22] Filed: May 25, 1993

Related U.S. Application Data

[63] Continuation of Ser. No. 926,383, Aug. 10, 1992, abandoned, which is a continuation of Ser. No. 585,978, Sep. 21, 1990, abandoned.

[30] Foreign Application Priority Data

Sep. 27, 1989 [JP] Japan .................................. 1-249076

[51] Int. Cl.$^5$ .................... H03K 17/10; H03K 19/092
[52] U.S. Cl. .................................. 307/443; 307/446; 307/451; 307/473; 307/491; 307/570; 307/296.4; 307/296.5
[58] Field of Search ................ 307/443, 446, 451, 473, 307/570, 491, 296.3–296.8, 261, 263; 330/265, 270, 264

[56] References Cited

U.S. PATENT DOCUMENTS

| 4,570,128 | 2/1986 | Monticelli | 330/267 |
| 4,644,198 | 2/1987 | Ahmed | 307/362 |
| 4,737,732 | 4/1988 | Westwick | 330/261 |

FOREIGN PATENT DOCUMENTS

| 0045344 | 2/1982 | European Pat. Off. | 307/473 |
| 0297639 | 1/1989 | European Pat. Off. | |
| 0318396 | 5/1989 | European Pat. Off. | |
| 0209225 | 12/1983 | Japan | 307/473 |

OTHER PUBLICATIONS

Gregorian et al., "Analog MOS Integrated Circuits for Signal Processing", Chap. 4, MOS Operational Amplifiers: (Publ. by John-Wiley & Sons, 1986), pp. 169–170.

Primary Examiner—Margaret R. Wambach
Attorney, Agent, or Firm—Finnegan, Henderson, Farabow, Garrett & Dunner

[57] ABSTRACT

A push-pull output stage circuit includes two series-connected transistors, receives an input signal and outputs a signal corresponding to the input signal. A control circuit detects a current flowing in the transistors and controls the push-pull circuit to keep an ineffective current flowing in the push-pull circuit at substantially a constant value.

7 Claims, 6 Drawing Sheets

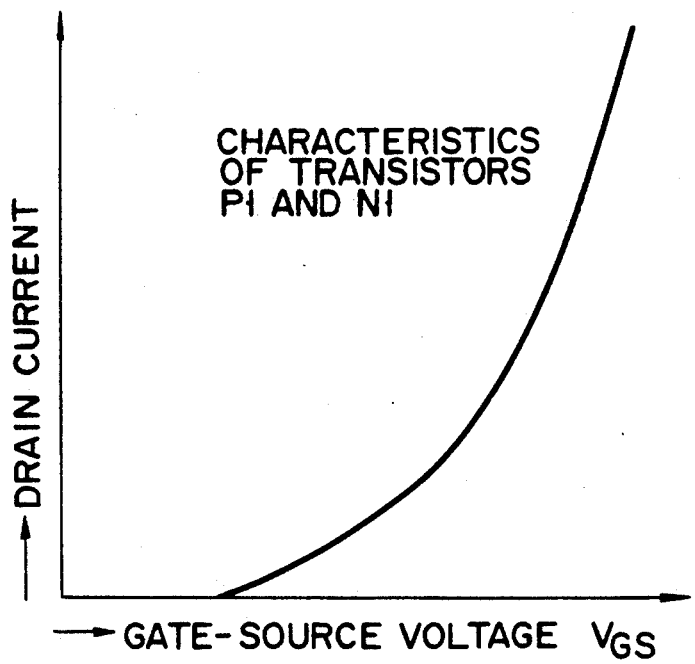
F I G. 5
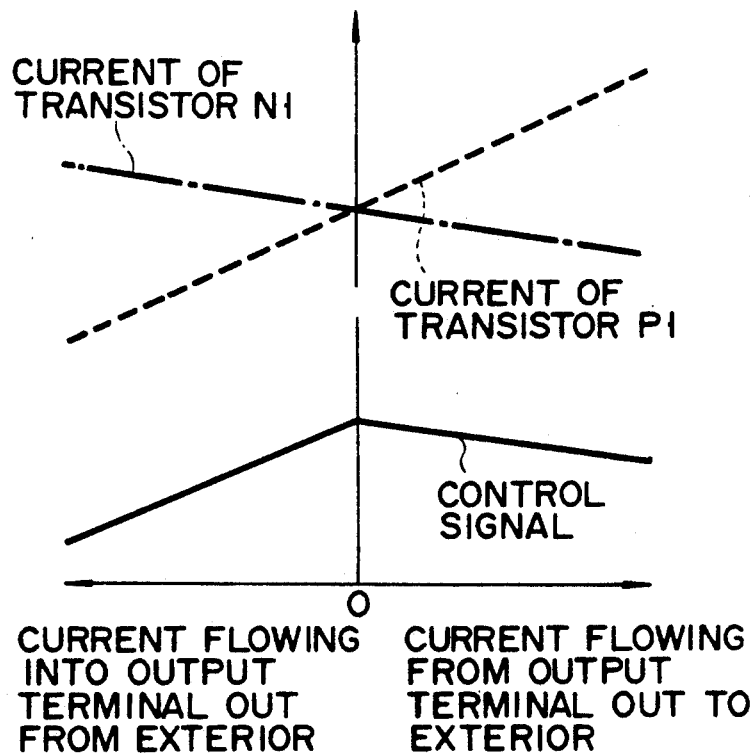
F I G. 6

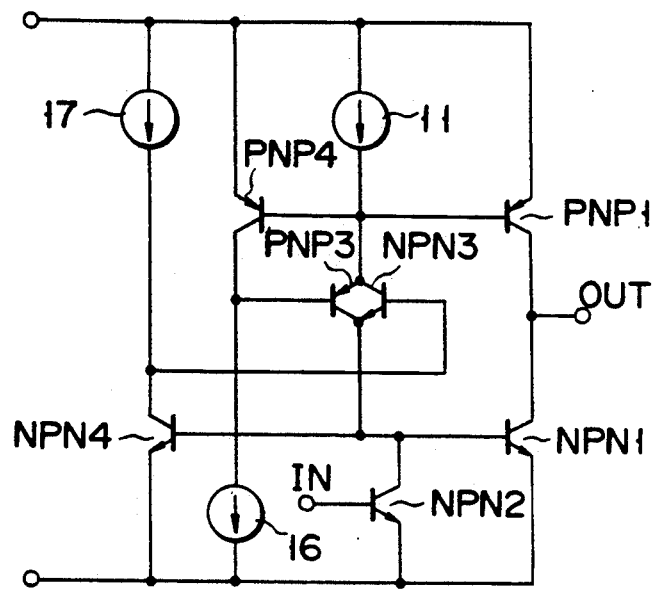
F I G. 9
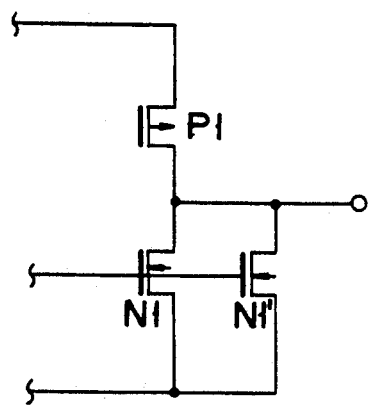
F I G. 11
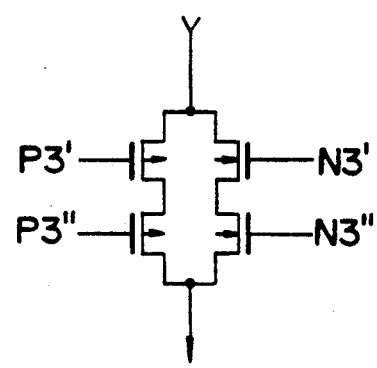
F I G. 12

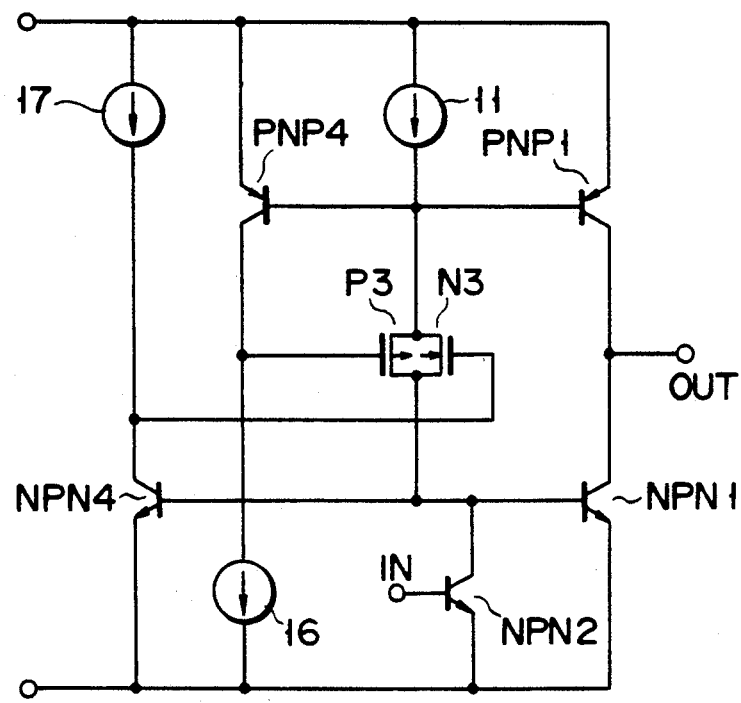
F I G. 10

PUSH-PULL CIRCUIT RESISTANT TO POWER SUPPLY AND TEMPERATURE INDUCED DISTORTION

This application is a continuation of application Ser. No. 07/926,383, filed Aug. 10, 1992, now abandoned, which in turn is a continuation of Ser. No. 07/585,978, filed Sep. 21, 1990, also abandoned.

BACKGROUND OF THE INVENTION

1. Field of the Invention

This invention relates to a push-pull output circuit used for a semiconductor integrated circuit.

2. Description of the Related Art

A push-pull output circuit is used in an output circuit of a semiconductor integrated circuit which is required to have characteristics that the amplitude of the output signal is large, the distortion of the output signal is small and the output current is large.

The construction of such a push-pull output circuit is explained with reference to FIGS. 1 and 2 below. As shown in FIG. 1, a P-channel MOS transistor P1 and an N-channel MOS transistor N1 are serially connected between a power source potential Vcc and a ground potential GND to constitute a push-pull output stage circuit. An output terminal OUT is connected to a connection node between the P-channel MOS transistor P1 and N-channel MOS transistor N1. Further, a current source circuit 71, a level shift circuit 72 and an N-channel MOS transistor N2 are serially connected between the Vcc potential and GND potential. The gate of the N-channel MOS transistor N2 for output control is connected to an input terminal IN to which an input signal is supplied. A connection node Ne between the current source circuit 71 and the level shift circuit 72 is connected to the gate of the P-channel MOS transistor P1. A connection node Nf between the level shift circuit 72 and the N-channel MOS transistor N2 is connected to the gate of the N-channel MOS transistor N1.

The push-pull output circuit shown in FIG. 2 is different from that of FIG. 1 in that the level shift circuit 72 is omitted, and a P-channel MOS transistor P2 and a second current source circuit 81 are connected between the Vcc potential and the GND potential. The gate of the N-channel MOS transistor N2 is connected to the input terminal IN. A connection node Ng between the gate and drain of the P-channel MOS transistor P2 is connected to the gate of the P-channel MOS transistor P1. A connection node Nh between the first current source circuit 71 and the N-channel MOS transistor N2 is connected to the gate of the N-channel MOS transistor N1.

In the push-pull output circuit of FIG. 1, the level shift amount (a difference between the potential of the node Ne and the potential of the node Nf) of the level shift circuit 72 is fixed and cannot be adjusted. Therefore, the bias voltage (voltage between the source and gate) of the two MOS transistors P1 and N1 varies substantially in proportion to variation in the Vcc potential. As a result, an ineffective current (which is a current flowing in the MOS transistors P1 and N1 when the output terminal OUT is set in the electrically floating state; static current; DC current) flowing in the two MOS transistors P1 and N1 constituting the push-pull output stage circuit will vary. Thus, the power consumption in the push-pull output circuit varies and the characteristic of the circuit also varies. Therefore, in the push-pull circuit of FIG. 1, it is necessary to use a constant voltage source whose output voltage is stable. Further, the ineffective current flowing in the push-pull output stage circuit may be largely influenced by variation in the threshold voltage of the MOS transistors P1 and N1. When attempts are made to suppress variation in the ineffective current, the process control may become severe or the yield of the semiconductor device will be lowered.

In the push-pull output circuit of FIG. 2, the P-channel MOS transistors P1 and P2 are connected in a current mirror configuration. The gate of the P-channel MOS transistor P1 is always applied with a constant bias voltage from the gate of the P-channel MO transistor P2, thereby causing a constant current to always flow in the P-channel MOS transistor P1. As a result, the maximum value of the output current in the push-pull output circuit becomes equal to that of a constant current flowing in the P-channel MOS transistor P1. Therefore, when a large output current is required, it becomes necessary to set the ineffective current at the time of no load to a large value, causing a larger power consumption

SUMMARY OF THE INVENTION

This invention has been made to solve the above problem, and an object thereof is to provide a push-pull output circuit which has a large amplitude characteristic, less distortion characteristic and large output current characteristic and has a relatively small ineffective current which may be kept constant irrespective of variations in the power source voltage and the characteristics of transistors.

Another object of this invention is to provide a push-pull output circuit having an improved performance.

Still another object of this invention is to provide a push-pull output circuit which is less influenced by variations in the power source voltage and the characteristics of transistors.

In order to attain the above objects, a push-pull circuit of this invention comprises an output circuit having first and second transistors (P1, N1) whose current paths are serially connected between a first potential (Vcc) and a second potential (GND); and potential difference setting means (13) for detecting a current level of at least one of currents flowing in the first and second transistors and setting a potential difference between signals supplied to the control terminals of the first and second transistors according to the result of detection.

With the above construction, a current flowing in the output circuit is detected and a potential difference between the signals supplied to the control terminals of the two transistors is controlled according to the result of detection. As a result, it becomes possible to keep an ineffective current flowing in the two transistors constituting the output circuit constant.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 5 is a diagram showing the characteristic between the gate-source voltage VGS and the drain current of a transistor in the push-pull output stage circuit of FIG. 4;

FIG. 6 is a characteristic diagram showing the relation between the ineffective current in the transistor of the push-pull output stage circuit of FIG. 4 and a control signal of a control signal generating circuit;

FIGS. 9 to 12 are diagrams showing modifications of the push-pull output circuit according to one embodiment of this invention.

DETAILED DESCRIPTION OF THE PREFERRED EMBODIMENTS

There will now be described a push-pull output circuit according to one embodiment of this invention with reference to the accompanying drawings.

Figure 3:
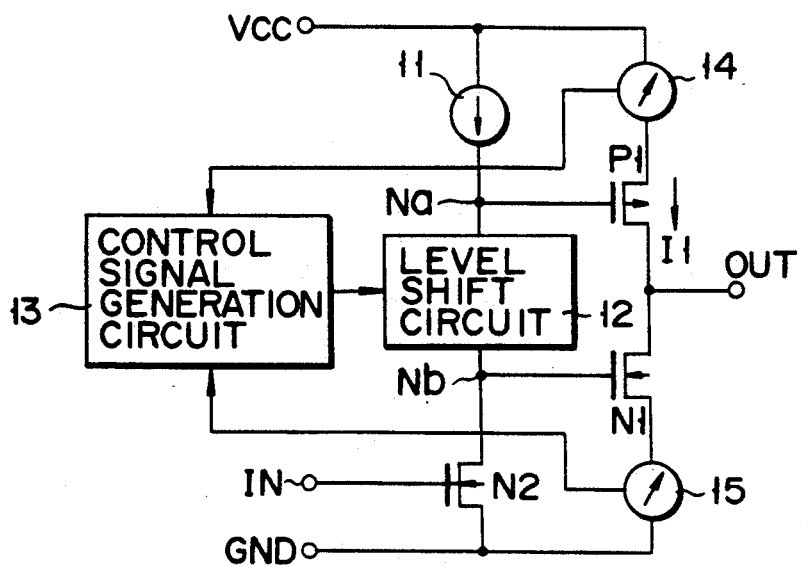
FIG. 3 is a diagram showing the construction of one embodiment of a push-pull output circuit according to this invention.

FIG. 3 shows a push-pull output circuit of CMOS structure used in the output circuit of a semiconductor integrated circuit which requires a large amplitude characteristic, less distortion characteristic and large output current characteristic.

The push-pull output circuit includes a push-pull output stage circuit constituted by a P-channel MOS transistor P1 and an N-channel MOS transistor N1 which are serially connected between a power source potential Vcc and a ground potential GND. The MOS transistors P1 and N1 have complementary characteristics. Further, as shown in FIG. 5, when the gate-source voltage VGS increases, the drain current increases in a quadratic manner.

Further, the push-pull output circuit includes a first constant current source circuit 11, level shift circuit 12 and N-channel MOS transistor N2 for output control which are serially connected between the Vcc potential and the GND potential.

A connection node Na between the first constant current source circuit 11 and level shift circuit 12 is connected to the control electrode (gate) of the MOS transistor P1. A connection node Nb between the level shift circuit 12 and output controlling MOS transistor N2 is connected to the gate of the MOS transistor N1.

Further, the push-pull output circuit includes a control signal generation circuit 13. In the drawing, reference numerals 14 and 15 denote circuits for detecting currents flowing in the two MOS transistors P1 and N1 of the push-pull output stage circuit and constituting part of the control signal generation circuit 13.

Next, the operation of the circuit of FIG. 3 is explained.

First, a general operation is explained.

The MOS transistor N2 is turned on or off according to the level of a signal supplied to the input terminal IN. The gate potentials of the MOS transistors P1 and N1 vary according to the on-off operation of the MOS transistor so that the resistance of the current paths of the MOS transistors P1 and N1 may be changed. As a result, an output signal having a level corresponding to the level of the input signal is output from the output terminal OUT. The potential of the output signal greatly varies between the ground potential GND and the power source potential Vcc.

The level shift circuit 12 adjusts (changes) the level shift amount (a potential difference between the nodes Na and Nb) according to a control signal supplied from the control signal generation circuit 13. The control signal generation circuit 13 detects the current level of a current flowing in the MOS transistors P1 and N1 by means of the circuits 14 and 15. The control signal generation circuit 13 supplies a control signal to the level shift circuit 12 to control the level shift amount of the level shift circuit 12 according to the detected current values so as to keep ineffective currents flowing in the MOS transistors P1 and N1 constant. For example, the control signal generation circuit 13 increases the level shift amount when the current level flowing in the MOS transistors P1 and N1 is raised. As a result the gate-source voltage (bias voltage) of the MOS transistors P1 and N1 is lowered, thereby causing the current flowing in the MOS transistors P1 and N1 to be reduced. On the other hand, the control signal generation circuit 13 reduces the level shift amount when the current level of a current flowing in the MOS transistors P1 and N1 is lowered. As a result, the gate-source voltage of the MOS transistors P1 and N1 is raised, thereby causing the current flowing in the MOS transistors P1 and N1 to be increased. Thus, the ineffective current flowing in the MOS transistors P1 and N1 can be kept constant.

In a case where an external circuit is connected to the output terminal OUT, it frequently occurs that a current may flow out to the exterior via the output terminal OUT or a current may flow into the output terminal from the exterior. In this case, the values of the currents flowing in the MOS transistors P1 and N become different from each other, and a current flowing in one of the MOS transistors becomes larger than that flowing in the other MOS transistor. For this reason, the level shift amount of the level shift circuit 12 is largely influenced by the magnitude of the output current and there occurs a possibility that the push-pull output circuit may effect an abnormal operation. However, such a possibility may be prevented if the control signal generation circuit 13 has a characteristic of outputting a control signal which is created mainly according to a smaller one of the currents flowing in the MOS transistors P1 and N1. One example of the characteristic is shown in FIG. 6. In FIG. 6, a control signal is created mainly according to a smaller one of the currents flowing in the MOS transistors P1 and N1. When the control signal generation circuit 13 is designed to have a characteristic as shown in FIG. 6, the gate-source voltage VGS of that one of the MOS transistors which permits output or input current flow can be set to be sufficiently high, thus causing a relatively large output current to be derived.

Figure 4:
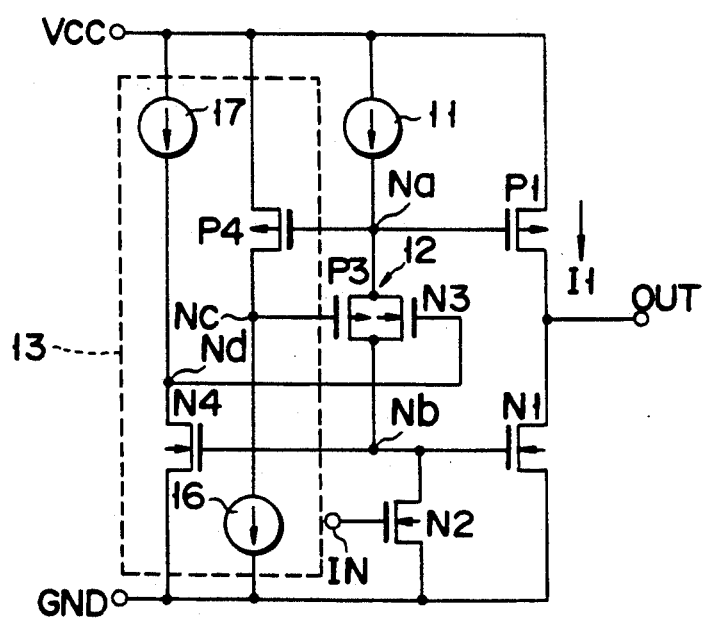
FIG. 4 is a circuit diagram showing a concrete example of the push-pull output circuit of FIG. 3.

Next, an example of a concrete circuit of the push-pull output circuit shown in the block form in FIG. 3 is explained with reference to FIG. 4. In FIG. 4, portions which are the same as those of FIG. 3 are denoted by the same reference numerals.

In FIG. 4, the level shift circuit 12 is constituted by a variable resistor formed of a P-channel MOS transistor P3 and an N-channel MOS transistor N3 whose current path is connected in parallel with the current path of the MOS transistor P3. The level shift circuit 12 effects the level shift operation according to a voltage drop caused across the current paths of the MOS transistors P3 and N3 by a current from the first constant current source circuit 11.

The control signal generation circuit 13 is constituted by a P-channel MOS transistor P4, a second constant current source circuit 16, a third constant current source circuit 17 and an N-channel MOS transistor N4. The current path of the P-channel MOS transistor P4 and the second constant current source 16 are serially connected between the Vcc potential and the GND potential. Further, the third constant current source circuit 17 and the current path of the N-channel MOS transistor N4 are serially connected between the Vcc potential and the GND potential.

The gate of the P-channel MOS transistor P4 is connected to the connection node Na (the gate of the P-channel MOS transistor P1). The gate of the N-channel MOS transistor N4 is connected to the connection node Nb (the gate of the N-channel MOS transistor N1). Further, a connection node (node Nc) between the P-channel MOS transistor P4 and the second constant current source circuit 16 is connected to the gate of the P-channel MOS transistor P3. A connection node (node Nd) between the third constant current source circuit 17 and the N-channel MOS transistor N4 is connected to the gate of the N-channel MOS transistor N3.

In this embodiment, the ratio of the W (channel width)/L (channel length) ratio of the MOS transistor P1 to a desired ineffective current is set to be the same as the ratio of the W/L ratio of the MOS transistor P4 to an output current of the constant current source circuit 16. Likewise, the ratio of the W/L ratio of the MOS transistor N1 to a desired ineffective current is set to be the same as the ratio of the W/L ratio of the MOS transistor N4 to an output current of the constant current source circuit 17. For example, when the ineffective current is set to 500 mA, the W/L ratio of the MOS transistor P1 is set to 10, and the W/L ratio of the MOS transistor P4 is set to 1, then the output current of the constant current source circuit 16 will be 50 mA.

Further, in this embodiment, the MOS transistors of the same conductivity type are formed in the same step in order to make variations in the characteristics thereof such as variations in the threshold voltages thereof equal to one another.

Next the operation of the push-pull output circuit shown in FIG. 4 is explained with reference to FIGS. 5 to 8.

The basic operation of the circuit shown in FIG. 4 is the same as that of the circuit of FIG. 3 and a signal having a level corresponding to the level of the signal supplied to the input terminal IN is derived from the output terminal OUT.

Next, the operations of the level shift circuit and control signal generation circuit are explained.

First, assume that no load is connected to the output terminal OUT. In this case, the magnitudes of currents flowing in the current paths of the two MOS transistors P1 and N1 of the push-pull output stage circuit are equal to each other.

Now, assume that the power source voltage Vcc is lowered in this condition.

As the power source voltage Vcc is lowered, currents flowing in the MOS transistors N1 and P1 become smaller. As the currents are reduced, the gate-source voltage of the MOS transistor N1 varies. Therefore, the resistance of the current path of the MOS transistor N4 which is applied with the same gate-source voltage as that of the MOS transistor N1 is raised. As a result, the potential of the drain (node Nd) of the MOS transistor N4 is raised. The gate of the N-channel MOS transistor N3 of the level shift circuit 1 is set to the raised potential to reduce the resistance of the current path of the MOS transistor N3.

On the other hand, as the current flowing in the MOS transistor P1 is reduced, the gate-source voltage of the MOS transistor P1 is lowered. Since the same gate-source voltage as that of the MOS transistor P1 is applied to the MOS transistor P4, the resistance of the current path of the MOS transistor P4 increases. As a result, the potential of the drain (node Nc) of the MOS transistor P4 is lowered. Reduction in the potential causes the resistance of the P-channel MOS transistor P3 to be lowered.

Reduction in the resistances of the current paths of the MOS transistors P3 and N3 constituting the level shift circuit 12 causes the potential of the node Na to be lowered, thereby raising the potential of the node Nb. That is, the level shift amount (a potential difference between the nodes Na and Nb) is reduced. Reduction in the level shift amount causes the source-gate voltage of the MOS transistors P1 and N1 to be raised.

As is understood from FIG. 5, with an increase in the source-gate voltage of the MOS transistors P1 and N1, currents flowing in the current paths of the MOS transistors P1 and N1 increase. As a result, a current (ineffective current) flowing in the push-pull output stage circuit can be kept constant irrespective of reduction in the power source voltage.

Next, assume that the power source voltage Vcc becomes high.

With an increase in the power source voltage Vcc, currents flowing in the current paths of the MOS transistors N1 and P1 increase. With an increase in the current flowing in the MOS transistor N1, the gate-source voltage of the MOS transistor N4 is increased. As a result, the resistance of the current path of the MOS transistor N4 is reduced to lower the potential of the drain (node Nd) of the MOS transistor N4. The gate of the N-channel MOS transistor N3 is set to the lowered potential so that the gate-source voltage of the MOS transistor N3 may be reduced and the resistance of the current path of the N-channel MOS transistor N3 will increase.

Further, with an increase in the current flowing in the MOS transistor P1, the gate-source voltage of the MOS transistor P1 increases. Since the same gate-source voltage as that of the MOS transistor P1 is applied to the MOS transistor P4, the resistance of the current path of the MOS transistor P4 increases. As a result, the potential of the drain (node Nc) of the MOS transistor P4 is raised. Rise in the potential causes the resistance of the P-channel MOS transistor P3 to increase.

The potential of the node Na is raised and the potential of the node Nb is lowered with an increase in the resistances of the current paths of the MOS transistors P3 and N3 constituting the level shift circuit 12. That is, the level shift amount is increased. Increase in the level shift amount causes the gate-source voltages of the MOS transistors P1 and N1 to be lowered. As is understood from FIG. 5, with a decrease in the source-gate voltages of the MOS transistors P1 and N1, currents flowing in the MOS transistors P1 and N1 are reduced. As a result, the current can be kept constant irrespective of an increase in the power source voltage Vcc.

Next, consider the operation of a circuit in a case wherein a load is connected to the output terminal OUT. The control signal generation circuit 13 shown in FIG. 4 also has a function of detecting only a smaller one of the currents and outputting a control signal based on the detected current.

For example, when a current is derived out from the output terminal OUT, a current flowing in the MOS transistor P1 becomes larger than that in the MOS transistor N1. With an increase in the current in the MOS transistor P1, the resistance of the current path of the MOS transistor P4 is reduced, and the current in the MOS transistor P4 tends to increase. However, the current is limited to a preset value by mean of the constant current source 16. Therefore, he potential of the node Nc is raised. The potential of the node Nc is applied to the gate of the P-channel MOS transistor P3 of the level shift circuit 12 and when the potential of the node Nc becomes equal to or higher than a preset level, the P-channel MOS transistor P3 is turned off. Therefore, even if a current flowing in the MOS transistor P1 becomes extremely large with an increase in the output current, the level shift amount of the level shift circuit 12 is not influenced by the output current when the current flowing in the MOS transistor P1 has exceeded the preset value.

However, even if the MOS transistor P3 is turned off, the potential of the node Nd is controlled by the current flowing in the current path of the MOS transistor N1 to control the resistance of the current path of the MOS transistor N3. As a result, the level shift amount of the level shift circuit 12 is controlled by the current flowing in the MOS transistor N1 to keep the ineffective current flowing in the MOS transistor N1 constituting the push-pull output stage circuit at substantially a constant level.

On the other hand, when a current flows into the output terminal OUT from the exterior, a current flowing in the MOS transistor N1 becomes larger than that in the MOS transistor P1. With an increase in the output current flowing into the output terminal OUT, a current flowing in the MOS transistor N1 increases. With an increase in the current flowing in the MOS transistor N1, the resistance of the current path of the MOS transistor N4 is lowered to lower the potential of the node Nd. When the potential of the node Nd becomes equal to or lower than a preset level, the N-channel MOS transistor N3 is turned off. Therefore, even if a current flowing in the MOS transistor N1 becomes large with an increase in the current flowing into the output terminal, the level shift amount of the level shift circuit 12 is not influenced by the input current when the current flowing in the MOS transistor N1 has exceeded a preset value.

However, even if the MOS transistor N3 is turned off, the potential of the node Nc is controlled by the current flowing in the current path of the MOS transistor P1 to control the resistance of the current path of the MOS transistor P3. As a result, the level shift amount of the level shift circuit 12 is controlled by the current flowing in the MOS transistor P1 to keep the ineffective current flowing in the MOS transistor P1 and N1 constituting the push-pull output stage circuit at substantially a constant level.

As described above, according to the push-pull output circuit shown in FIGS. 3 and 4, the ineffective current can be kept at substantially a constant value even if the power source voltage and the characteristics of the MOS transistors have varied. Further, influence on the control signal generation circuit 13 by currents flowing out from the output terminal or flowing into the output terminal from the exterior can be removed.

Now, the characteristic of the push-pull output circuit shown in FIG. 4 is explained in comparison with that of the conventional case.

Figure 1:
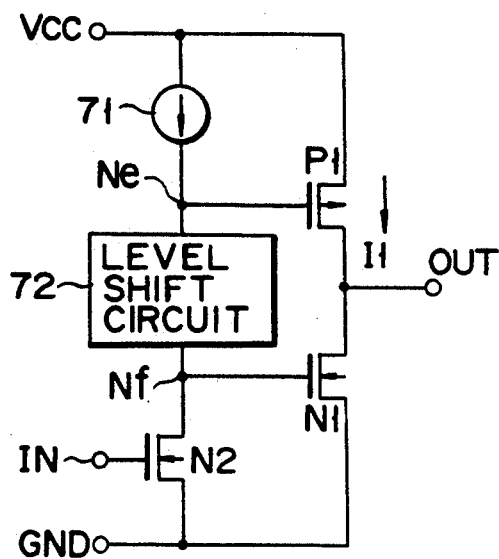
FIGS. 1 and 2 are circuit diagrams showing the construction of the conventional push-pull output circuits.
Figure 2:
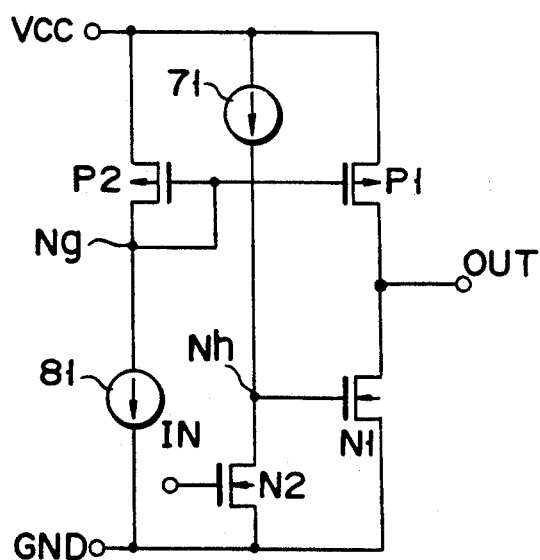
Figure 7:
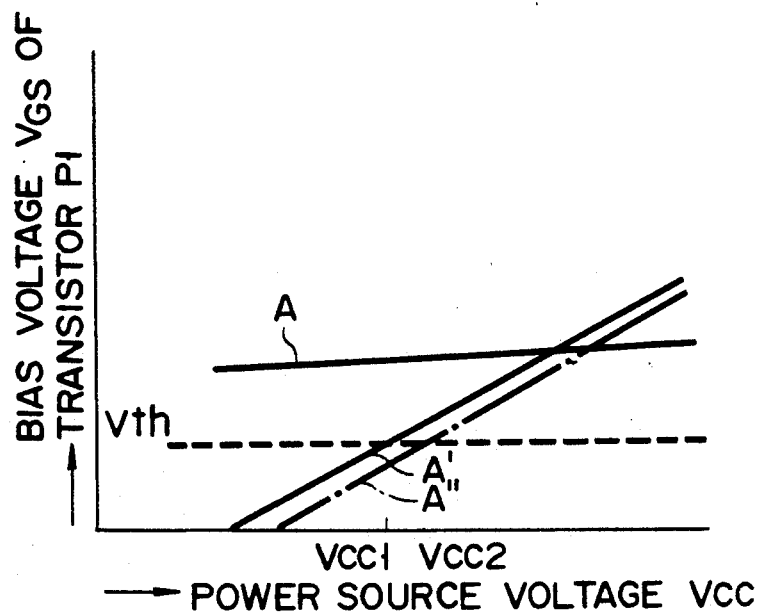
FIG. 7 is a diagram showing the relation between the power source voltage and the bias voltage VGS of the MOS transistor P1 in the push-pull output circuit of FIGS. 1 and 4.

A curve A in FIG. 7 indicates the relation between the gate-source voltage VGS of the MOS transistor P1 of the push-pull output circuit shown in FIG. 4 and the power source voltage Vcc. For comparison, the relations between the gate-source voltage VGS of the MOS transistor P1 of the conventional push-pull output circuit shown in FIG. 1 and the power source voltage Vcc are indicated by curves A' and A". Further, a curve Vth indicates variation in the threshold voltage of the MOS transistor P1.

Figure 8:
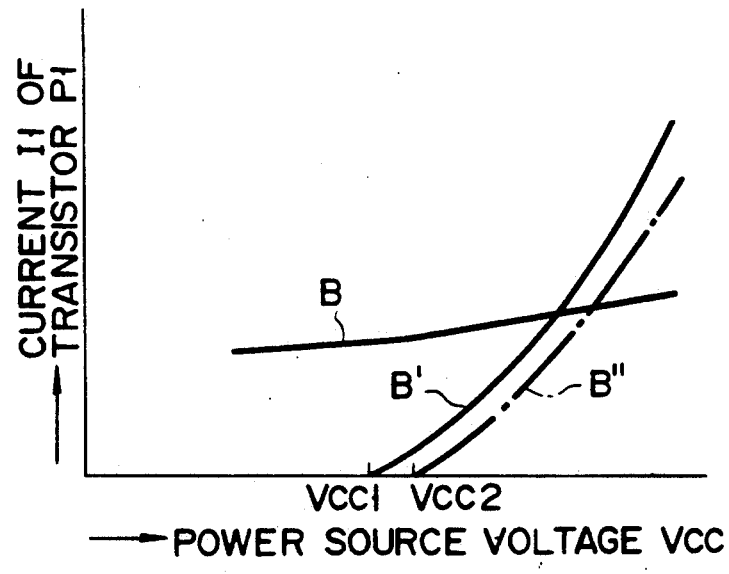
FIG. 8 is a diagram showing the relation between the power source voltage and a current flowing in the MOS transistor P1 of FIGS. 1 and 4.

On the other hand, a curve B of FIG. 8 indicates the relation between the ineffective current Il in the MOS transistor P1 of the push-pull output circuit shown in FIG. 4 and the power source voltage Vcc. For comparison, the relations between the ineffective current Il in the MOS transistor P1 of the push-pull output circuit shown in FIG. 1 and the power source voltage Vcc are indicated by curves B' and B".

The inclination of the characteristic curve A in FIG. 7 and the inclination of the characteristic curve B in FIG. 8 indicate variation in the current of the current source circuits 11, 16 and 17 in the push-pull output circuit of FIG. 4 and variation in the drain-source voltage of the MOS transistor P1.

As is clearly seen from FIGS. 7 and 8, according to this invention, the bias voltage VGS and ineffective current Il are kept substantially constant irrespective of variation in the power source voltage Vcc. In contrast, in the push-pull output circuit of FIG. 1, the bias voltage VGS of the MOS transistor P1 varies with the power source voltage Vcc as indicated by the characteristic curve A'. Further, in the circuit of FIG. 1, the ineffective current Il of the MOS transistor P1 exhibits the quadrant characteristic as indicated by the characteristic curve B' of FIG. 8 when the bias voltage VGS has exceeded the threshold voltage Vth of the MOS transistor P1.

The curve A" of FIG. 7 shows a case wherein the threshold voltage Vth of the P-channel MOS transistor P1 has varied and indicates the bias voltage VGS of the P-channel MOS transistor P1 with the threshold voltage Vth set as a reference value. In this case, as shown by the curve B" of FIG. 8, the ineffective current Il is significantly varied.

As is seen from FIGS. 7 and 8, according to this embodiment, even when the threshold voltage Vth of the P-channel MOS transistor P1 of the push-pull output stage circuit has varied, the threshold voltage Vth of the P-channel MOS transistor P4 varies in the same manner so that the gate-source voltage of the P-channel MOS transistor P3 of the level shift circuit 12 will be kept unchanged and a voltage of the bias node Na can be kept unchanged.

The construction of the push-pull output circuit is not limited to the above embodiment. For example, an anti-oscillation circuit can be added to the above circuit, and it is also possible to set the size of the P-channel MOS transistor P4 and N-channel MOS transistor N4 to, for example, twice that of the MOS transistors P1 and N1 in order to enhance the sensitivity of detecting currents flowing in the two MOS transistors P1 and N1 of the push-pull output stage circuit.

Further, in the above embodiment, MOS transistors are used as transistors, but it is also possible to use bipolar transistors or BiCMOS technique to constitute the circuits as shown in FIGS. 9 and 10. In the construction of FIG. 9, substantially the same effect as that of the above embodiment can be obtained. Further, elements other than the MOS transistors and bipolar transistors may be used.

The MOS transistors of the same conductivity type are preferably formed in the same step in order to make equal variations in the characteristics such as variations in the threshold voltages. However, they may be formed in different steps.

Further, in a case where a signal of a certain level is supplied to the input terminal IN, it is also possible to exchange the power source potential Vcc and the ground potential GND with each other, reverse the direction of flow of the current of the current source circuit and change the conductivity types of the transistors (for example, use P-channel and N-channel MOS transistors instead of the N-channel and P-channel MOS transistors, respectively).

For example, the output stage circuit may be formed as shown in FIG. 11, and the level shift circuit may be formed as shown in FIG. 12. Further, the control signal generation circuit may be constructed to perform the operation based on data from the ammeters 14 and 15 so as to control the level shift amount, for example.

According to the above embodiments of this invention, it is possible to provide a push-pull output circuit which has a large amplitude characteristic, less distortion characteristic and large output current characteristic and is less influenced by variations in the power source voltage and the characteristics of transistors.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A push-pull circuit comprising:
   an output stage circuit connected between a first potential and a second potential and having a first transistor of a first conductivity type and a second transistor of a second conductivity type whose current paths are serially connected;
   a level shift circuit having a third transistor of the first conductivity type and a fourth transistor of the second conductivity type whose current path is connected in parallel with the current path of said third transistor of the first conductivity type;
   a control circuit having a fifth transistor of the first conductivity type and a first current source circuit which are serially connected between said first and second potentials, and a second current source circuit and a sixth transistor of the second conductivity type which are serially connected between said first and second potentials;
   wherein a control terminal of said fifth transistor of the first conductivity type is connected to a control terminal of said first transistor of the first conductivity type and one of output terminals of said level shift circuit;
   a control terminal of said sixth transistor of the second conductivity type is connected to a control terminal of said second transistor of the second conductivity type and the other output terminal of said level shift circuit;
   a connection node between said fifth transistor of the first conductivity type and said first current source circuit is connected to a control terminal of said third transistor of the first conductivity type; and
   a connection node between said second current source circuit and said sixth transistor of the second conductivity type is connected to a control terminal of said fourth transistor of the second conductivity type.

2. A push-pull circuit according to claim 1, further comprising:
   a third current source connected between said level shift circuit and said first potential; and an output controlling transistor having a current path connected between said level shift circuit and said second potential, for receiving an input signal at the control terminal thereof.

3. A push-pull circuit according to claim 1, wherein a first ratio is defined as (W1/L1/I1, where W1/L1 is defined as a ratio channel width/channel length of said first transistor and I1 is defined as a desired ineffective current;
   wherein a second ratio is defined as (W2/L2/IO2, where W2/L2 is defined as a channel width/channel length of said fifth transistor and IO12 is defined as an output current of said first current source circuit, the first ratio being substantially equal to the second ratio;
   wherein a third ratio is defined as (W3/L3/I3, where W3/L3 is defined as a channel width/channel length of said second transistor and I3 is defined as a desired ineffective current; and
   wherein a fourth ratio is defined as (W4/L4)/IO4, where W4/L4 is defined as a channel width/channel length of said sixth transistor and IO4 is defined as an output current of said second current source circuit, the third ratio being substantially equal to the fourth ratio.

4. A push-pull circuit according to claim 1, wherein said first to sixth transistors are formed of MOS transistors or bipolar transistors.

5. A push-pull circuit comprising:
   an output stage circuit having first and second transistors whose current path are serially connected between a first potential and a second potential;
   means responsive to gate/source voltage signals from said first and second transistors for generating control voltage signals dependent on the current flowing in said first and second transistor;
   means for setting a potential difference between signals supplied to control terminals of said first and second transistors according to the control voltage signals supplied from said generating means;
   said potential difference setting means including level shift means, connected to control terminals of said first and second transistors, for setting a variable potential difference between signals supplied to the control terminals of said first and second transistors;

wherein the current level of at least one of the currents flowing in said first and second transistors is detected and the control signal is supplied to said level shift means to set the ineffective currents flowing in said first and second transistors to a constant value according to the detected current level;

said level shift means constituted by a current source, a level shift circuit and an output controlling transistor which are serially connected between said first and second potentials;

a signal on a connection node between said current source and said level shift circuit being supplied to a control terminal of said first transistor, and a signal on a connection node between said level shift circuit and said output controlling transistor being supplied to a control terminal of said second transistor; and said control signal generation means controlling the level shift amount of said level shift circuit by the control signal.

6. A push-pull circuit comprising:

an output stage circuit having first and second transistors whose current paths are serially connected between a first potential and a second potential;

means responsive to gate/source voltage signals from said first and second transistors for generating control voltage signals dependent on the current flowing in said first and second transistor;

means for setting a potential difference between signals supplied to control terminals of said first and second transistors according to the control voltage signals supplied from said generating means;

said potential difference setting means including a level shift circuit having a third transistor and a fourth transistor whose current path is connected in parallel with the current path of said third transistor; and said generating means including:

a control circuit having a fifth transistor and a first current source circuit which are serially connected between said first and second potentials; and a second current source circuit and a sixth transistor which are serially connected between said first and second potentials;

a control terminal of said fifth transistor connected to a control terminal of said first transistor and an output terminal of said level shift circuit;

a control terminal of said sixth transistor is connected to a control terminal of said second transistor and another output terminal of said level shift circuit;

a connection node between said fifth transistor and first current source circuit connected to the control terminal of said third transistor; and a connection node between said second current source circuit and sixth transistor connected to the control terminal of said fourth transistor.

7. A push-pull circuit according to claim 6, further comprising a third current source connected between said level shift circuit and said first potential; and an output controlling transistor having a current path connected between said level shift circuit and second potential and a control terminal connected to receive an input signal.

* * * * *